(12) United States Patent
Teranaka

(10) Patent No.: US 10,602,611 B2
(45) Date of Patent: Mar. 24, 2020

(54) ROBOT CONTROL APPARATUS, ROBOT, AND ROBOT SYSTEM

(71) Applicant: Seiko Epson Corporation, Tokyo (JP)

(72) Inventor: Ryosuke Teranaka, Matsumoto (JP)

(73) Assignee: Seiko Epson Corporation (JP)

( * ) Notice: Subject to any disclaimer, the term of this patent is extended or adjusted under 35 U.S.C. 154(b) by 396 days.

(21) Appl. No.: 15/234,468

(22) Filed: Aug. 11, 2016

(65) Prior Publication Data

US 2017/0055359 A1  Feb. 23, 2017

(30) Foreign Application Priority Data

Aug. 19, 2015 (JP) .................................. 2015-161677
Aug. 19, 2015 (JP) .................................. 2015-161678
Aug. 19, 2015 (JP) .................................. 2015-161679

(51) Int. Cl.
*H05K 1/14* (2006.01)
*B25J 9/16* (2006.01)
*H05K 7/14* (2006.01)

(52) U.S. Cl.
CPC .............. *H05K 1/142* (2013.01); *B25J 9/161* (2013.01); *H05K 7/1467* (2013.01); *H05K 7/1482* (2013.01)

(58) Field of Classification Search
CPC .... H05K 7/1474; H05K 1/142; H05K 7/1447; H05K 7/1462; H05K 7/1482; H05K 7/20136; B25J 9/161
See application file for complete search history.

(56) References Cited

U.S. PATENT DOCUMENTS

| 7,208,716 B2 * | 4/2007 | Belau .................... H04N 5/2251 |
| | | 250/208.1 |
| 2007/0119049 A1 * | 5/2007 | Teranaka ................ B25J 9/1602 |
| | | 29/740 |
| 2007/0123081 A1 | 5/2007 | Hirabayashi |
| 2009/0178506 A1 * | 7/2009 | Yamamoto ............... B25J 9/102 |
| | | 74/490.03 |
| 2010/0262285 A1 * | 10/2010 | Teranaka ................ B25J 9/1602 |
| | | 700/245 |

(Continued)

FOREIGN PATENT DOCUMENTS

| JP | S52-071310 U | 5/1977 |
| JP | S54-066198 U | 5/1979 |

(Continued)

OTHER PUBLICATIONS

Extended European Search Report for Patent Application No. EP16184483.2 dated Feb. 7, 2017 (7 pages).

*Primary Examiner* — James Wu
*Assistant Examiner* — Hung Dang
(74) *Attorney, Agent, or Firm* — Harness, Dickey & Pierce, P.L.C.

(57) ABSTRACT

A robot control apparatus is configured to include a power supply board including a power supply circuit and a driving board including a driving circuit that drives a robot with electric power supplied from the power supply board. In the thickness direction of the power supply board, the distance between a surface of the power supply board, on which the power supply circuit is provided, and a surface of the driving board, on which the driving circuit is provided, is smaller than the maximum height of the power supply board.

7 Claims, 6 Drawing Sheets

(56) References Cited

U.S. PATENT DOCUMENTS

| | | | | |
|---|---|---|---|---|
| 2011/0029133 | A1* | 2/2011 | Okazaki | A61G 7/1017 |
| | | | | 700/258 |
| 2011/0297654 | A1* | 12/2011 | Yoshikawa | B23K 26/046 |
| | | | | 219/121.62 |
| 2012/0063133 | A1* | 3/2012 | Takeuchi | G02F 1/133603 |
| | | | | 362/235 |
| 2012/0215358 | A1* | 8/2012 | Gettings | B25J 5/005 |
| | | | | 700/259 |
| 2015/0277426 | A1* | 10/2015 | Ogata | B25J 9/1694 |
| | | | | 700/253 |

FOREIGN PATENT DOCUMENTS

| | | |
|---|---|---|
| JP | S56-155477 U | 11/1981 |
| JP | S60-180025 U | 11/1985 |
| JP | S63-155676 U | 10/1988 |
| JP | S63-165887 U | 10/1988 |
| JP | H01-139488 U | 9/1989 |
| JP | H09-223876 A | 8/1997 |
| JP | 2002-237687 A | 8/2002 |
| JP | 2007-144589 A | 6/2007 |
| JP | 2007-144590 A | 6/2007 |
| JP | 2007-175858 A | 7/2007 |
| JP | 2011-031316 A | 2/2011 |
| JP | 2012-206239 A | 10/2012 |
| JP | 2014-104573 A | 6/2014 |
| JP | 2015-136780 A | 7/2015 |

\* cited by examiner

ROBOT CONTROL APPARATUS, ROBOT, AND ROBOT SYSTEM

BACKGROUND

1. Technical Field

The present invention relates to a robot control apparatus.

2. Related Art

There has been known a configuration in which a robot control apparatus is connected to a robot and the robot is driven according to electric power, signals, and the like supplied from the robot control apparatus.

For example, JP-A-2014-104573 (Patent Literature 1) discloses a configuration in which boards are disposed in a housing, electric power, signals, and the like supplied to a robot are generated by circuits on the boards, and the electric power, the signals, and the like are supplied to the robot by wires.

JP-A-2007-144590 (Patent Literature 2) discloses a configuration in which a robot RB, a computer PC, and a power cable 49 are connected to a robot controller.

JP-A-2011-031316 (Patent Literature 3) discloses a configuration in which, in a control apparatus including a front unit and an inner side unit, the front unit can be drawn out forward.

In the technique in the past described above (see Patent Literature 1), the boards disposed in the housing include a board disposed in parallel to the bottom surface of the housing and a board disposed perpendicularly to the bottom surface of the housing. In general, a board has a flat shape. A direction perpendicular to the thickness direction is extremely long compared with the thickness direction. Therefore, in a configuration in which both of the board disposed in parallel to the bottom surface and the board disposed perpendicularly to the bottom surface are present, when the boards are incorporated in the housing, long spaces are necessary in both of the direction parallel to the bottom surface and the direction perpendicular to the bottom surface. Therefore, it is difficult to reduce the size of a housing of a robot control section.

In general, a robot controller is set in a setting section such as a cell. A plurality of other devices such as an uninterruptible power supply device are set in the setting section. Therefore, a plurality of devices are set in the setting section, for example, side by side or one on top of another. When a robot is used in a factory or the like, the setting section is desirably space saving. Other devices are often disposed adjacent to the side surfaces of the robot controller. Therefore, it is difficult to connect external wires to the side surfaces after setting the robot controller. Consequently, as in the technique in the past (see Patent Literature 2), when the power cable is connected to the side surfaces of the robot controller, it is necessary to connect the external wires to the side surfaces of the robot controller before the setting and thereafter set the robot controller in the setting section.

In order to connect the external wires to the robot controller before the setting and thereafter set the robot controller in the setting section, sufficient length is necessary for the external wires. However, when the robot controller is set in the setting section in a state in which the long external wires are connected to the robot controller in this way, the external wires hinder the setting of the other devices and the robot controller. That is, when the external wires are connected to the side surfaces, it is difficult to perform extra length management for the external wires. It is also difficult to control routes of the external wires after the setting.

In the technique in the past (see Patent Literature 3), since the front unit is drawn out forward, it is possible to access the inner side unit. However, in the technique in the past, after the front unit is drawn out, a space for accessing the inner side unit is secured by opening the front unit to the left and the right with a hinge. Therefore, the front unit is in an attached state to the control device. In this state, the front unit could hinder maintenance work for, for example, accessing the inner side unit. Since the front unit is retracted to the left and the right by the hinge, spaces for retracting the front unit are necessary on the left and the right of the control device. Therefore, a wide space is necessary in order to perform maintenance.

SUMMARY

An advantage of some aspects of the invention is to solve at least a part of the problems, and the invention can be implemented as the following forms or application examples.

APPLICATION EXAMPLE 1

A robot control apparatus according to this application example includes: a power supply board including a power supply circuit; and a driving board including a driving circuit that drives a robot with electric power supplied from the power supply board. In the thickness direction of the power supply board, the distance between a surface of the power supply board, on which the power supply circuit is provided, and a surface of the driving board, on which the driving circuit is provided, is smaller than the maximum height of the power supply board.

APPLICATION EXAMPLE 2

The configuration like the application example described above can be implemented as, for example, a configuration in which the driving board is disposed within a range in the height direction of a maximum height portion of the power supply board.

That is, in the configuration in which the robot control apparatus includes the power supply board and the driving board, the driving board is disposed not to protrude upward and downward in the height direction from both the ends in the height direction of the power supply board. Therefore, the height of a structure including both of the power supply board and the driving board does not exceed the maximum height of the power supply board. Therefore, it is possible to prevent the size in the height direction of the robot control apparatus including the power supply board and the driving board from becoming excessively large. As a result, it is possible to reduce the robot control apparatus in size.

APPLICATION EXAMPLE 3

In a configuration in which the driving board is disposed on the same plane as the power supply board, a degree of freedom of circuit design is high compared with a configuration in which the boards are not disposed on the same plane.

APPLICATION EXAMPLE 4

The robot control apparatus may be configured to further include a housing, and boards are disposed in the housing. An example of such a configuration may include a configuration in which the robot control apparatus includes a housing of a plurality of boards including the power supply board and the driving board, and a board including a largest number of interfaces to external wires among the plurality of boards is disposed closer to the front surface of the housing on the inside of the housing than a board including a smallest number of interfaces to the external wires among the plurality of boards. That is, electric power and signals are supplied to the boards in the housing by the external wires present on the outside of the housing. The electric power and the signals are supplied to a robot and the like on the outside from the boards in the housing by the external wires.

When a board including a large number of interfaces to the external wires is disposed in a position distant from the front surface of the housing, sufficiently large length needs to be secured in a large number of internal wires. It is difficult to lay the internal wires. A large number of internal wires is present in the housing. Therefore, if the configuration is adopted in which the board including the largest number of interfaces to the external wires among the plurality of boards is disposed closer the front surface of the housing on the inside of the housing than the board including the smallest number of interfaces to the external wires among the plurality of wires, it is possible to reduce the internal wires in length.

APPLICATION EXAMPLE 5

The robot control apparatus may be configured such that the robot control apparatus further includes a fan disposed in a position closer to the driving board than the power supply board. With the configuration in which the robot control apparatus includes the fan disposed in the position closer to the driving board than the power supply board, it is possible to efficiently cool the driving circuit of the driving board.

APPLICATION EXAMPLE 6

The robot control apparatus may be configured such that the fan is located on a surface different from the front surface of the housing. With this configuration, it is possible to dispose the fan in a position distant from a user who can work on the front surface side of the housing. This serves as noise measures.

APPLICATION EXAMPLE 7

The robot control apparatus may be configured such that the height of the robot control apparatus is 30 mm or more and 89 mm or less. With this configuration, it is possible to provide the robot control apparatus that can be set in a range of 2U (1.75 inches×2) of the standard of a rack mount.

APPLICATION EXAMPLE 8

The robot control apparatus may be configured to further include a control board including a control circuit that controls the robot, and the control board is disposed on the same plane as the power supply board.

APPLICATION EXAMPLE 9

The robot control apparatus may be configured such that the robot includes a plurality of driving sections, and the plurality of driving sections are driven by the same driving board. In this configuration, it is possible to drive the robot including the plurality of driving sections with the driving circuit on one driving board. Therefore, it is possible to easily dispose the driving board in a thin space compared with a configuration in which the plurality of driving sections are driven by a plurality of driving boards (e.g., a configuration in which one driving section is driven by one driving board). Therefore, it is possible to easily reduce the robot control apparatus in thickness.

APPLICATION EXAMPLE 10

The technical idea of the robot control apparatus explained above may be embodied as a robot controlled by the robot control apparatus. Various configurations can be adopted.

APPLICATION EXAMPLE 11

The technical idea of the robot control apparatus explained above may be embodied as a robot system including: the robot control apparatus; and a robot controlled by the robot control apparatus. Various configurations can be adopted.

APPLICATION EXAMPLE 12

A robot control apparatus according to this application example includes a housing including side surfaces and covers. At least a part of external wires connected to the robot control apparatus is drawn around along the side surfaces by the covers.

That is, in the robot control apparatus, wires extend from the inside to the outside of the robot control apparatus. The external wires on the outside of the robot control apparatus are drawn around using the inner sides of the covers as passages. The covers form passages of the external wires such that the external wires are drawn around along the side surfaces of the housing. Consequently, the external wires are directed to the direction of the rear surface along the side surfaces of the robot control apparatus through predefined passages. Therefore, it is easy to perform extra length management for the external wires.

APPLICATION EXAMPLE 13

The robot control apparatus according to the application example 12 may be configured such that the outer surface of the housing includes a front surface, and connecting sections to the external wires are provided only on the front surface of the housing. In this configuration, the external wires connected to the connecting sections on the front surface of the housing are drawn around to the side surfaces along the front surface. In this configuration, it is possible to easily attach and detach the external wires to and from the connecting sections present on the front surface in a state in which the robot control apparatus is set in a setting section.

APPLICATION EXAMPLE 14

The robot control apparatus according to the application example 12 or 13 may be configured such that the covers only have to be configured such that the external wires can be drawn around to the side surfaces. For example, a configuration in which the covers are located on the front surface of the housing may be adopted. With this configuration, it is possible to draw around the external wires from the front surface to the side surfaces of the housing through passages formed on the front surface of the housing.

APPLICATION EXAMPLE 15

The robot control apparatus according to any one of the application examples 12 to 14 may be configured such that the covers are located on the side surfaces of the housing. With this configuration, it is also possible to draw around the external wires from the front surface to the side surfaces of the housing through passages formed on the side surfaces of the housing and draw around the external wires to the rear surface direction.

APPLICATION EXAMPLE 16

The robot control apparatus according to any one of the application examples 12 to 15 may be configured such that at least a part of the covers is detachably attachable. With this configuration, it is possible to connect the external wires to the front surface of the housing in a state in which at least a part of the covers is detached from the housing. Connection work is facilitated.

APPLICATION EXAMPLE 17

The robot control apparatus according to any one of the application examples 12 to 16 may be configured such that the housing includes a rear surface, and the external wires are drawn around to the rear surface side of the housing along the side surfaces of the housing. With this configuration, it is possible to draw around the external wires to the rear surface side. Excessively wide spaces are unnecessary for the external wires on the side surfaces of the housing. Therefore, even in a configuration in which the length in the width direction can be regulated, it is unnecessary to excessively reduce the width of the robot control apparatus. It is possible to sufficiently increase the internal space of the robot control apparatus.

APPLICATION EXAMPLE 18

The robot control apparatus according to any one of the application examples 12 to 17 may be configured such that the housing includes a front surface and a rear surface, the covers are located on the side surfaces of the housing, and at least a part of end faces on the rear surface side in the covers is located further on the front surface side than the rear surface of the housing. That is, a configuration may be adopted in which at least a part of the covers located on the side surfaces does not reach the rear surface of the housing. With this configuration, it is possible to draw around the external wires from the side surface sides to other parts rather than from the rear surface side when a space further on the inner side than the rear surface of the robot control apparatus is narrow.

APPLICATION EXAMPLE 19

The technical idea of the robot control apparatus explained above may be embodied as a robot controlled by the robot control apparatus according to anyone of the application examples 12 to 18. Various configurations can be adopted.

APPLICATION EXAMPLE 20

The technical idea of the robot control apparatus may be embodied as a robot system including: the robot control apparatus according to any one of the application examples 12 to 18; and a robot controlled by the robot control apparatus. Various configurations can be adopted.

APPLICATION EXAMPLE 21

A robot control apparatus according to this application example includes a housing including a first unit and a second unit in which a robot control section is provided. The second unit is separable from the first unit by being drawn out from the first unit.

That is, since the second unit is separable from the first unit, in a state in which the first unit is set in a setting section (a cell, etc.) of the robot control apparatus, it is possible to separate the second unit from the setting section by drawing out the second unit from the first unit.

Therefore, if the second unit is separated from the first unit, it is possible to maintain, in a place where work is easily performed, the robot control section (a board, a circuit, etc.) included in the second unit.

APPLICATION EXAMPLE 22

The robot control apparatus according to the application example 21 may be configured such that the first unit includes a regulating section that regulates an insertion amount of the second unit into the first unit and does not regulate the draw-out of the second unit from the first unit. That is, excessive insertion of the second unit into the first unit is prevented and appropriate positioning is performed by the regulating section. When the second unit is drawn out, the draw-out is not regulated by the regulating section. Therefore, it is possible to draw out the second unit from the first unit.

APPLICATION EXAMPLE 23

In the robot control apparatus according to the application example 21 or 22, the first unit may configure an upper surface, a bottom surface, and side surfaces of the housing, and the second unit may configure a front surface, a rear surface, and the bottom surface of the housing.

APPLICATION EXAMPLE 24

The robot control apparatus according to the application example 23 may be configured such that a fan is located on a surface different from the front surface of the housing. With this configuration, it is possible to dispose the fan in a position distant from a user who can work on the front surface side of the housing. This serves as noise measures.

APPLICATION EXAMPLE 25

The robot control apparatus according to the application example 23 or 24 may be configured such that connecting sections to external wires are provided only on the front surface of the housing on the outer surface of the housing. That is, the robot control section included in the second unit is configured to exchange electric power, signals, and the like via the external wires. Therefore, internal wires included in the robot control section need to be connected to the external wires via connectors or the like. Therefore, if the configuration is adopted in which the connecting sections such as the connectors for the external wires are provided only on the front surface of the housing, it is possible to easily attach and detach the external wires to and from the connecting sections present on the front surface in a state in which the robot control apparatus is set in the setting section.

APPLICATION EXAMPLE 26

The robot control apparatus according to any one of the application examples 23 to 25 may be configured such that the housing includes covers, and at least apart of the external wires connected to the robot control apparatus is drawn around from the front surface to the side surfaces of the second unit by the covers. That is, the external wires are drawn around using the inner sides of the covers as passages on the outside of the robot control apparatus. The covers form passages of the external wires such that the external wires are drawn around to the side surfaces around the front surface of the housing. With this configuration, the length of the external wires is regulated by the covers. It is possible to suppress the external wires from becoming excessively long. Therefore, it is easy to manage the external wires on the outside of the robot control apparatus.

APPLICATION EXAMPLE 27

The robot control apparatus according to any one of the application examples 21 to 26 may be configured such that a grip parallel to the bottom surface is provided in the second unit. With this configuration, a user can easily draw out the second unit using the grip.

APPLICATION EXAMPLE 28

The robot control apparatus according to the application example 27 may be configured such that the end face of the grip on the front surface side of the housing is present further on the rear surface side than the end face of the housing on the front surface side. That is, in a state in which the second unit is inserted into the first unit, the end face located most on the front surface side is the end face (a wall surface of the second unit, wall surfaces of the covers, etc.) of the housing. The end face of the grip is located further on the inner side (the rear surface side) than the end face of the housing. With this configuration, the grip does not project to the front surface side. It is possible to suppress the grip from hindering, for example, work of the user or the like.

APPLICATION EXAMPLE 29

The robot control apparatus according to any one of the application examples 21 to 28 may be configured such that the robot control section includes a plurality of boards, and the plurality of boards are disposed in positions not overlapping one another when the plurality of boards are viewed from the upper surface of the housing. That is, a configuration may be adopted in which, when the plurality of boards are projected in a direction perpendicular to the bottom surface, projection views of the plurality of boards on the bottom surface do not overlap one another. With this configuration, when maintenance of a certain board is performed, the other boards less easily hider the maintenance.

APPLICATION EXAMPLE 30

The technical idea of the robot control apparatus explained above may be embodied as a robot controlled by the robot control apparatus according to anyone of the application examples 21 to 29. Various configurations can be adopted.

APPLICATION EXAMPLE 31

The technical idea of the robot control apparatus explained above may be embodied as a robot system including: the robot control apparatus according to any one of the application examples 21 to 29; and a robot controlled by the robot control apparatus. Various configurations can be adopted.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
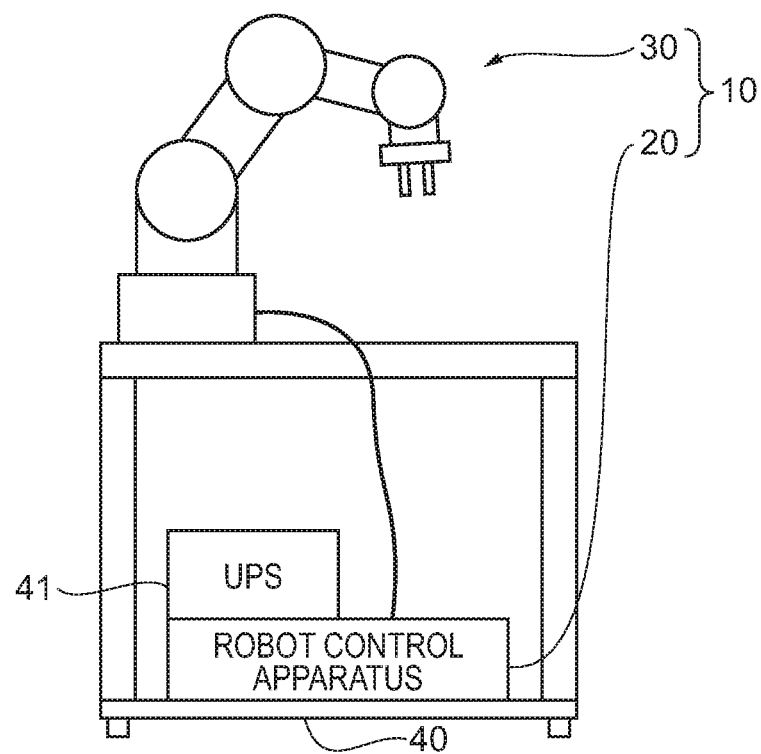
FIG. 1A is a block diagram showing a robot system according to an embodiment of the invention.

An embodiment of the invention is explained according to the order described below.
(1) Configuration of a robot control apparatus
(1-1) Configuration of a housing
(1-2) Internal configuration of a second unit
(1-3) Configuration of covers
(2) Other embodiments
(1) Configuration of a Robot Control Apparatus FIG. 1A is a block diagram showing the configuration of a robot system 10 according to an embodiment of the invention. The robot system 10 according to this embodiment includes a robot control apparatus 20 and a robot 30. The robot control apparatus 20 includes various circuits for controlling the robot 30. The robot 30 is configured to be capable of realizing predetermined functions when a plurality of driving sections are driven.

In this embodiment, the driving sections are driven by a motor. The robot control apparatus 20 and the robot 30 are connected by an external wire. Electric power and signals are exchanged between the robot control apparatus 20 and the robot 30 via the external wire.

Further, electric power can be supplied to the robot control apparatus 20 from an external power supply via a not-shown external wire. In this embodiment, the robot 30 is set in an upper part of a cell 40. The cell 40 is a structure, on the inner side of which various apparatuses including the robot control apparatus 20 can be set. In this embodiment, the cell 40 is a structure including a rectangular parallelepiped member and square-pillar-like members extending in a direction perpendicular to one surface of the rectangular parallelepiped at the four corners of the one surface. Note that, in FIG. 1A, an example is shown in which a UPS (Uninterruptible Power Supply) 41 is set as an apparatus other than the robot control apparatus 20.

Figure 1B:
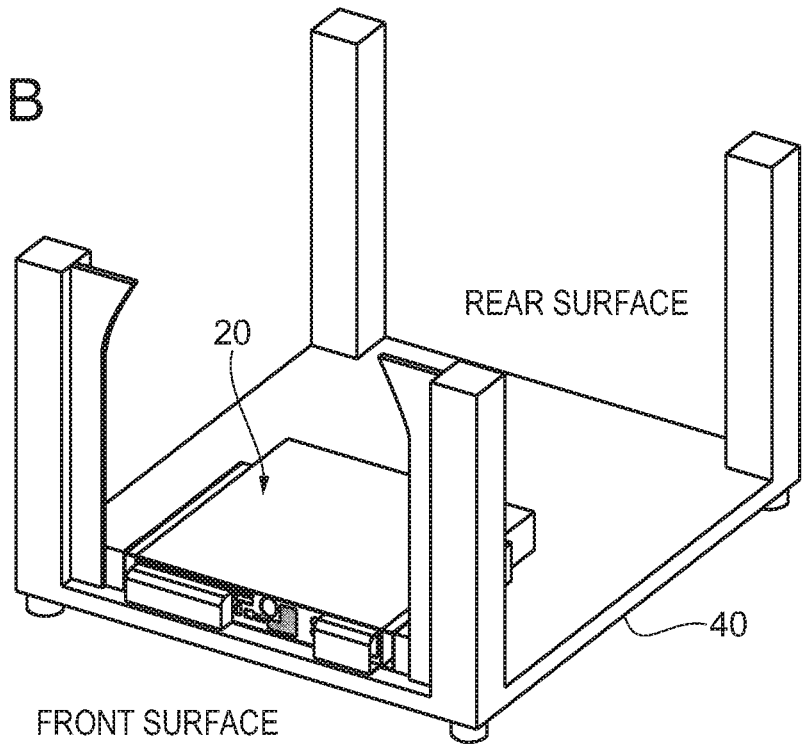
FIG. 1B is a diagram showing a robot control apparatus set in a cell.

FIG. 1B is a perspective view showing a state in which the robot control apparatus 20 is set in the cell 40. In this embodiment, a position where a user is present when operating the robot 30 and the robot control apparatus 20 is regarded as the front surface of the robot control apparatus 20. A surface opposed to the front surface is regarded as the rear surface of the robot control apparatus 20. An upper surface and a bottom surface are defined along the vertical direction. Surfaces other than the front surface, the rear surface, the upper surface, and the bottom surface are regarded as side surfaces. The bottom surface of the cell 40 is substantially square. The bottom surface is, for example, a surface having size of 600 mm×600 mm. In the cell 40, four square-pillar-like members extend perpendicularly to the bottom surface. Therefore, an apparatus having length slightly smaller than one side of the bottom surface can be freely put in and taken out from the inner side of the cell 40 and set in the cell 40.

Figure 2A:
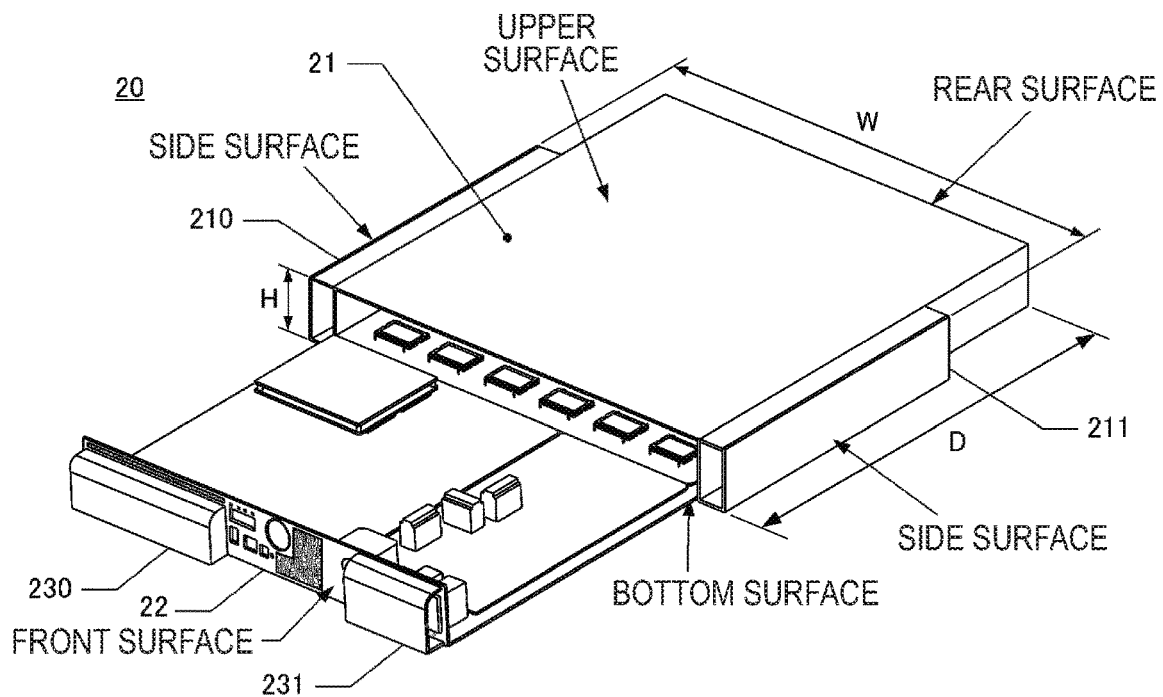
FIG. 2A is a perspective view of the robot control apparatus.

FIG. 2A is a perspective view extracting and showing the robot control apparatus 20. In this embodiment, the robot control apparatus 20 has a substantially rectangular parallelepiped external shape. Width W (the distance between the side surfaces) is 440 mm, depth D (the distance between the front surface and the rear surface) is 430 mm, and height H (the distance between the upper surface and the bottom surface) is 70 mm. In this embodiment, a housing of the robot control apparatus 20 includes a portion of a hexahedron and covers 230 and 231 and covers 210 and 211 attached to the front surface and the side surfaces of the hexahedron.

(1-1) Configuration of the Housing

In this embodiment, the robot control apparatus 20 is separable. That is, the housing of the robot control apparatus 20 includes a first unit 21 and a second unit 22 in which a robot control section (a power supply board 220, a driving board 221, and a control board 222) for controlling the robot 30 is provided. The first unit 21 can be fixed to the cell 40 by screws and the like. It is possible to draw out the second unit 22 from the first unit 21 in a state in which the first unit 21 is set in the cell 40 and separate the second unit 22 and the first unit 21.

In this embodiment, the first unit 21 configures the upper surface, the bottom surface, and the side surfaces of a rectangular parallelepiped portion of the robot control apparatus 20. The second unit 22 configures the front surface, the rear surface, and the bottom surface of the rectangular parallelepiped portion of the robot control apparatus 20. That is, the first unit 21 is a cylindrical body, an opening section of which is rectangular. The second unit 22 is a structure formed by extending the front surface and the rear surface perpendicularly from the bottom surface.

In the configuration including the surfaces explained above, the rear surface of the second unit 22 has a size and a shape that can be inserted from the opening section of the first unit 21. In a state in which the rear surface of the second unit 22 is inserted into the opening section of the first unit 21, it is possible to move the second unit 22 back and forth (in a direction perpendicular to the front surface and the rear surface) while disposing the bottom surface of the second unit 22 on the bottom surface of the first unit 21. Therefore, in this embodiment, it is possible to draw out the second unit 22 from the first unit 21 set in the cell 40.

Further, the first unit 21 includes a regulating section that regulates an insertion amount of the second unit 22 into the first unit 21 and does not regulate draw-out of the second unit 22 from the first unit 21. Specifically, a stopper is provided in the first unit 21. The stopper regulates the second unit 22 not to be capable of being inserted further to the inner side than a state in which the second unit 22 is inserted into the first unit 21 and the rear surface of the second unit 22 coincides with the end face on the rear surface side of the first unit 21. The stopper can be realized by various configurations. For example, in a perspective view shown in FIG. 5B, a configuration is shown in which a projecting section 210c is provided in the first unit 21 and the insertion is regulated when the projecting section 210c comes into contact with the second unit 22.

With this configuration, excessive insertion of the second unit 22 into the first unit 21 is prevented and proper positioning is performed by the regulating section. On the other hand, when the second unit 22 is drawn out, since the draw-out is not regulated by the regulating section, it is possible to draw out the second unit 22 from the first unit 21. Naturally, in a state in which the second unit 22 is regulated by the regulating section of the first unit 21, the first unit 21 and the second unit 22 may be fixed by screws and the like.

With this configuration, in a state in which the robot control apparatus 20 is set in the cell 40, it is possible to separate the second unit 22 from the first unit 21 and carry the second unit 22 to a place where work is easily performed. Therefore, it is possible to easily maintain the robot control section included in the second unit 22.

(1-2) Internal Configuration of the Second Unit

Figure 2B:
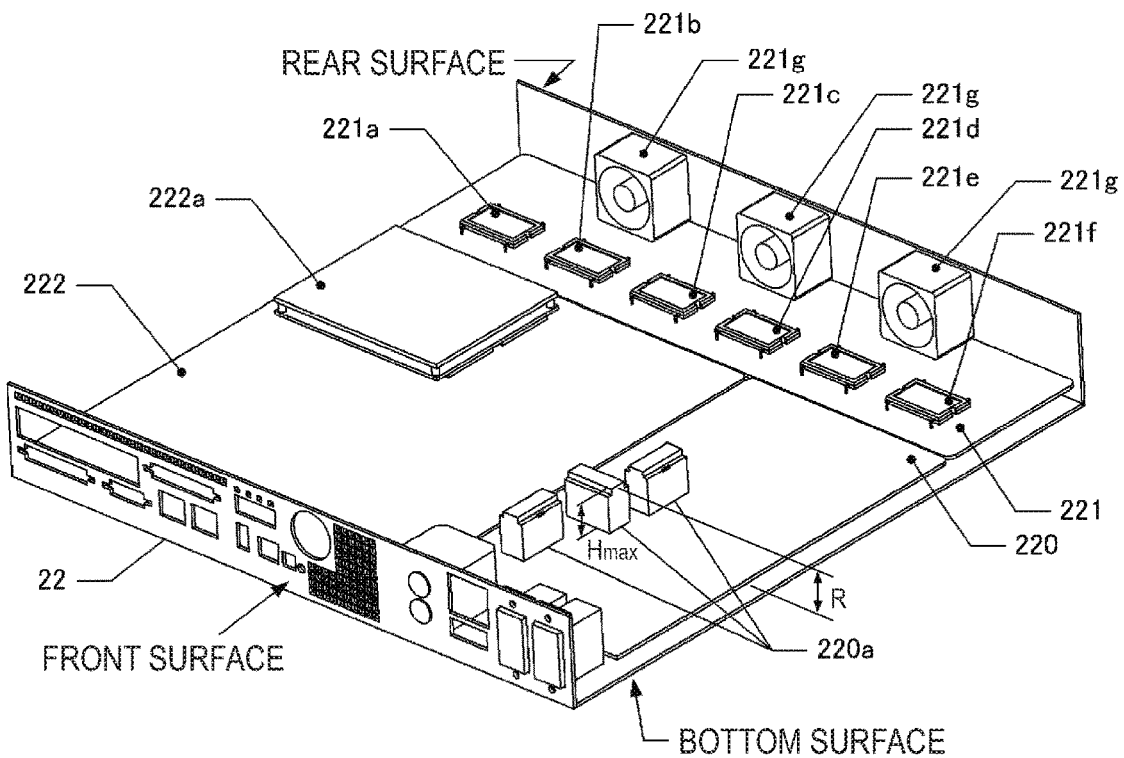
FIG. 2B is a perspective view of a second unit.

FIG. 2B is a perspective view showing the internal configuration of the second unit 22. As shown in the figure, a plurality of boards are attached to the second unit 22. Specifically, the power supply board 220, the driving board 221, and the control board 222 are attached to the second unit 22.

The power supply board 220 includes a power supply circuit. The power supply circuit formed on the power supply board 220 is a circuit that generates electric power supplied to the driving board 221 and the control board 222. The power supply circuit converts the frequency and the voltage of electric power supplied from the external power supply (in this embodiment, electric power supplied from a UPS) and supplies the electric power to the boards. Therefore, mounted components 220a such as a plurality of transformers and a noise filter are mounted on the power supply board 220.

The driving board 221 includes a driving circuit that drives the robot 30 with the electric power supplied from the power supply board 220. The driving circuit formed on the driving board 221 is a circuit for driving motors included in the robot 30. The driving circuit generates, with one chip, electric power supplied to one motor. Therefore, in this embodiment, in order to supply electric power to a respective plurality of motors, a plurality of chips ($221a$ to $221f$) are mounted on the driving board 221. In this embodiment, the chips $221a$ to $221f$ include circuits that convert the frequency and the voltage of the electric power supplied from the power supply board 220 into a three-phase alternating current. The motors of the robot 30 are driven by the three-phase alternating current.

As explained above, in this embodiment, the driving sections included in the robot 30 are driven by the driving circuit on the single driving board 221. That is, in this embodiment, electric power supplied to the one motor is generated by the one chip (any one of $221a$ to $221f$). All the chips $221a$ to $221f$ are mounted on the single driving board 221. Therefore, in this embodiment, entire electric power that should be supplied to the motors of the robot 30 is generated by the driving circuit on one driving board 221. Therefore, compared with a configuration in which a plurality of driving sections are driven by a plurality of driving boards, it is possible to form a driving circuit in a thin space. Therefore, it is possible to easily reduce the robot control apparatus 20 in thickness.

The control board 222 includes a control circuit that controls the robot 30. The control circuit formed on the control board 222 is a circuit that controls the operation of the robot 30. The control circuit includes a control section 222a configured by a CPU, a ROM, a RAM, and the like. The control section 222a is capable of executing a predetermined control program. The control section 222a or the like outputs a control signal to the robot 30 according to the control program to cause the robot 30 execute a predetermined operation.

The robot control apparatus 20 includes the power supply board 220, the driving board 221, and the control board 222. However, in this embodiment, the driving board 221 and the control board 222 are disposed in a range in the height direction of a maximum height portion of the power supply board 220. In the power supply board 220, the maximum height portion is a highest portion in the mounted components 220a of the power supply board 220. The range in the height direction of the maximum height portion is a range R formed by a sum of the height (Hmax shown in FIG. 2B) of the highest portion in the mounted components 220a and the thickness of the power supply board 220. That is, the range R in the height direction of the maximum height portion of the power supply board 220 is a range between both the ends in the height direction of the power supply board 220.

In this embodiment, the driving board 221 and the control board 222 are disposed to be included in the range R, that is, not to protrude above and below the range R in the height direction. Therefore, in this embodiment, the height of the structure including the power supply board 220, the driving board 221, and the control board 222 does not exceed the maximum height of the power supply board 220. Therefore, it is possible to prevent the size in the height direction of the robot control apparatus 20 including the power supply board 220, the driving board 221, and the control board 222 from becoming excessively large. Therefore, it is possible to reduce the robot control apparatus 20 in size.

Note that, in this embodiment, since the driving board 221 and the control board 222 are disposed on the same plane as the power supply board 220, the driving board 221 and the control board 222 are configured to be included in the range in the height direction of the maximum height portion of the power supply board 220. With the configuration explained above, it is possible to easily dispose the driving board 221 within the range in the height direction of the maximum height portion of the power supply board 220. With the configuration explained above, compared with a configuration in which the boards are not disposed on the same plane, visibility of the boards, the circuits on the boards, the mounted components, and the like is improved and work concerning components and the like is facilitated.

Further, compared with the configuration in which the boards are not disposed on the same plane, a degree of freedom of circuit design increases. For example, in the configuration in which the boards are not disposed on the same plane, since workability is deteriorated if terminals of internal wires connected among the boards are disposed at the edges of the boards, the positions of the terminals are easily restricted. However, if the boards are disposed on the same plane, it is possible to connect the internal wires even if the terminals are disposed at the edges of the boards.

Note that, in the circuits disposed on the inside of the robot control apparatus 20, in general, the capacity of the power supply circuit, which receives supply of electric power from the external power supply and performs power conversion and the like, is the largest. That is, in order to configure the power supply circuit on the power supply board 220, bulk components having height larger than board thickness in the height direction from a mounting surface of the board such as transformers are necessary. On the other hand, the driving board 221 only has to receive the electric power processed by the power supply board 220 and generate a three-phase alternating current for motor driving. Therefore, the height of the bulk components can be set to the height of chips 221a to 221f smaller than the mounted components 220a on the power supply board 220. The same applies in the control board 222. The height of the bulk components can be set smaller than the height of the mounted components 220a on the power supply board 220.

Therefore, in this embodiment, the maximum height of the power supply board 220> the maximum height of the driving board 221 and the maximum height of the power supply board 220> the maximum height of the control board 222. Therefore, as in this embodiment, by disposing the driving board 221 and the control board 222 within the range in the height direction of the maximum height portion of the power supply board 220, it is possible to reduce the height of the robot control apparatus 20.

Further, in this embodiment, the power supply board 220, the driving board 221, and the control board 222 are disposed in positions not overlapping one another when the power supply board 220, the driving board 221, and the control board 222 are viewed from the upper surface of the housing. That is, when the plurality of boards are projected in a direction perpendicular to the bottom surface, projection views of the plurality of boards on the bottom surface do not overlap. With this configuration, when maintenance of a certain board is performed, the other boards less easily hinder the maintenance.

In this embodiment, the power supply board 220 and the control board 222 are disposed on the front surface side and the driving board 221 is disposed on the rear surface side. A board including a largest number of interfaces to external wires among the plurality of boards is disposed closer to the front surface of the housing on the inside of the housing than a board including a smallest number of interfaces to the external wires among the plurality of boards. That is, electric power and signals are supplied to the power supply board 220, the driving board 221, and the control board 222 in the housing, which includes the first unit 21 and the second unit 22, by external wires present outside the housing. The electric power and the signals are supplied to the robot 30 and the like on the outside from the boards in the housing by the external wires.

As shown in FIG. 2B, holes for attaching various connectors are formed on the front surface of the second unit 22. The boards in the housing and external apparatuses (the UPS, the robot 30, etc.) are connected through the holes. Since it is necessary to connect the external wires to the connectors, the connectors are desirably integrated in a small number of places. In this embodiment, holes for the connectors are provided such that the external wires can be connected to only the front surface of the second unit 22 (holes for the connectors are not provided on the surfaces other than the front surface of the second unit 22).

Figure 3A:
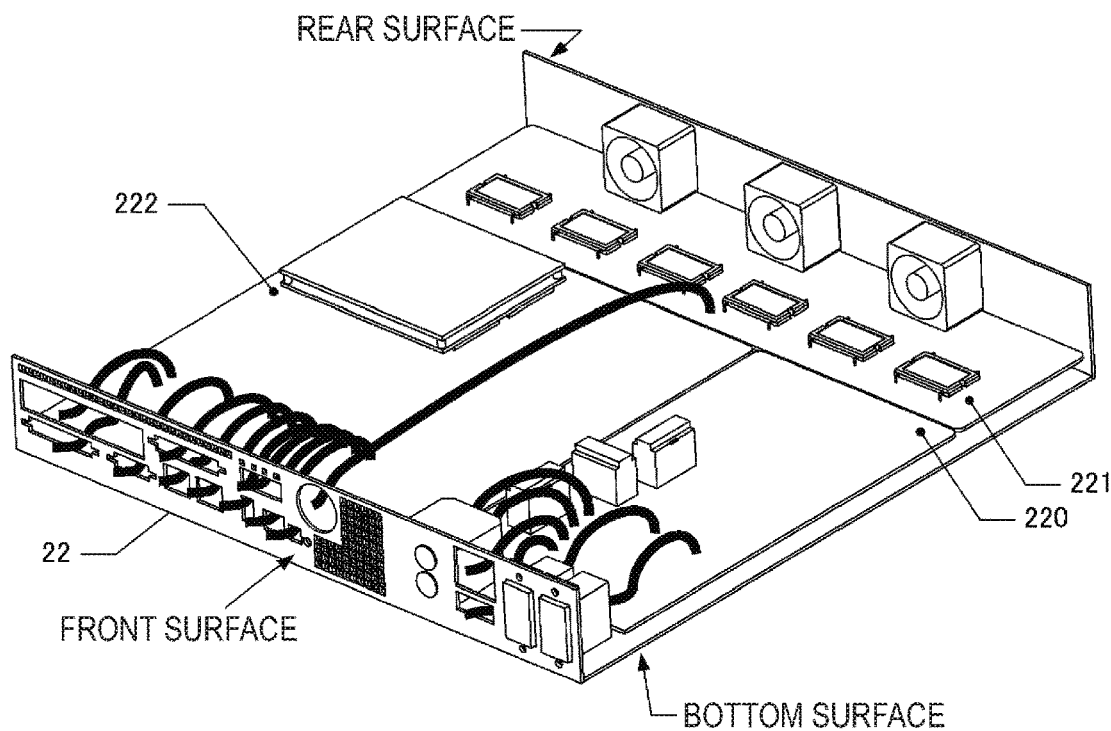
FIG. 3A is a perspective view showing an example of internal wires of the second unit.

Usually, internal wires extending from the boards are connected to the external wires via connecting sections such as connectors. However, the number of internal wires that should be connected to perform such connection is different depending on a board. Therefore, if a configuration is adopted in which a board including a largest number of interfaces to the external wires (in this example, internal wires connected to the external wires) is disposed closer to the front surface of the housing on the inside of the housing, it is possible to integrate the internal wires in the housing on the front surface of the housing as much as possible. FIG. 3A is a diagram schematically showing internal wires extending from the power supply board 220, the driving board 221, and the control board 222 to connectors attached to the front surface of the second unit 22. The internal wires are indicated by thick curved lines. In this embodiment, as shown in FIG. 3A, the number of internal wires connected to the control board 222> the number of internal wires connected to the power supply board 220> the number of internal wires connected to the driving board 221.

Figure 3B:
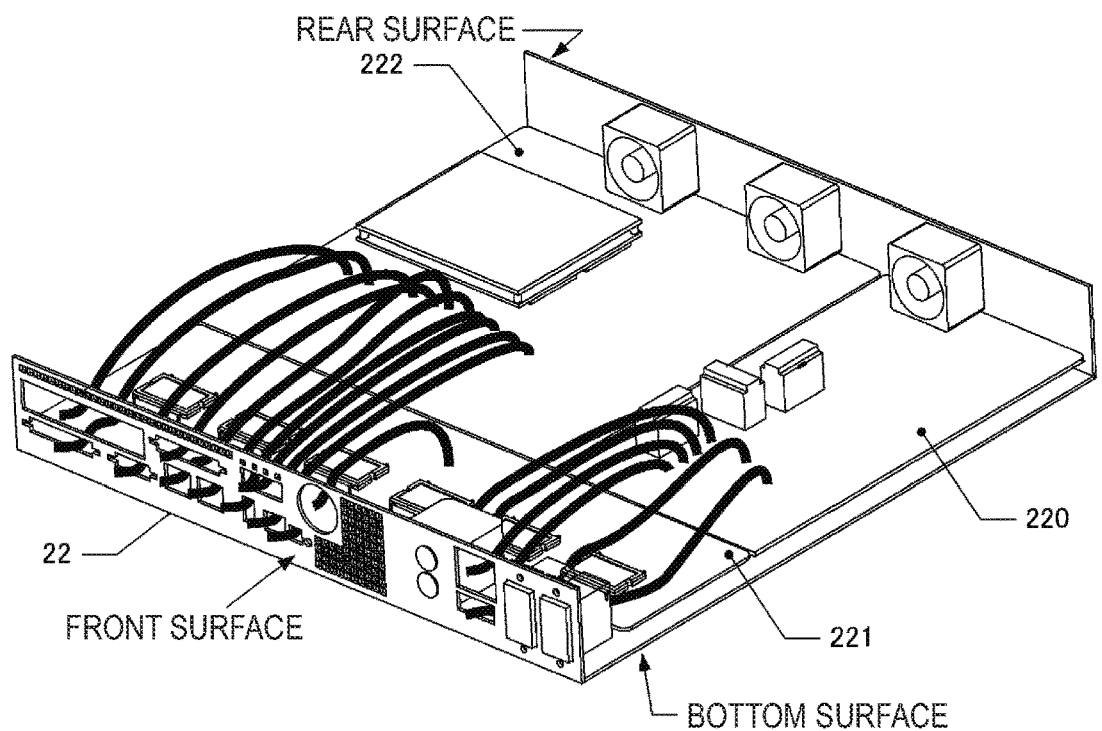
FIG. 3B is a perspective view showing a comparative example of the internal wires of the second unit.

In this embodiment in which the numbers of the internal wires to be connected are in a relation of the control board 222> the power supply board 220> the driving board 221 because the internal wires are connected to the connecting sections such as the connector and the external wires are connected to the connecting sections, a board including a largest number of interfaces to the external wires is disposed closer to the front surface of the housing on the inside of the housing than a board including smallest number of interfaces to the external wires. On the other hand, FIG. 3B shows a configuration example in which the positions of the power supply board 220, the driving board 221, and the control board 222 in the second unit 22 are changed and the driving board 221 including a smallest number of interfaces to the external wires is disposed close to the front surface of the housing. The internal wires are indicated by thick curved lines.

As shown in FIG. 3B, in a configuration in which a board including a small number of interfaces to external wires is disposed closer to the front surface of the housing on the inside of the housing than a board including a large number of interfaces, compared with the configuration shown in FIG. 3A, which is not the disposition, the length of the internal wires is large. That is, if the board including the large number of interfaces to the external wires is disposed in a position distant from the front surface of the housing, long wires are necessary in a large number of internal wires. As a result, it is difficult to lay the internal wires and a large number of internal wires are present in the housing. However, if a board including a relatively large number of interfaces to the external wires is disposed closer to the front surface than a board including a relatively small number of interfaces to the external wires, it is possible to minimize the internal wires. Further, when the connecting sections to the external wires are integrated on the front surface of the housing, the user of the robot control apparatus 20 only has to perform connection work for the external wires only on the front surface of the robot control apparatus 20. Maintenance work is extremely easy.

Further, in this embodiment, as shown in FIG. 2B, fans 221g are provided on the rear surface of the second unit 22. That is, on the rear surface of the second unit 22, the fans 221g are attached such that main bodies of the fans 221g are disposed in an upper part of the driving board 221 and on the inner side of the housing. As a result, in this embodiment, the fans 221g are disposed in positions closer to the driving board 221 than the power supply board 220 and the control board 222.

In this embodiment, the robot 30 includes a plurality of driving sections. Motors that drive the driving sections are driven by the chips 221a to 221f. The chips 221a to 221f include power converting sections or the like for generating electric power for driving the motors. Therefore, heat generating bodies (the chips 221a to 221f) as many as the motors of the robot 30 are present on the driving board 221. Therefore, if the fans 221g are disposed in the positions closer to the driving board 221 than the current board 220, it is possible to efficiently cool the chips 221a to 221f of the driving board 221.

Figure 5A:
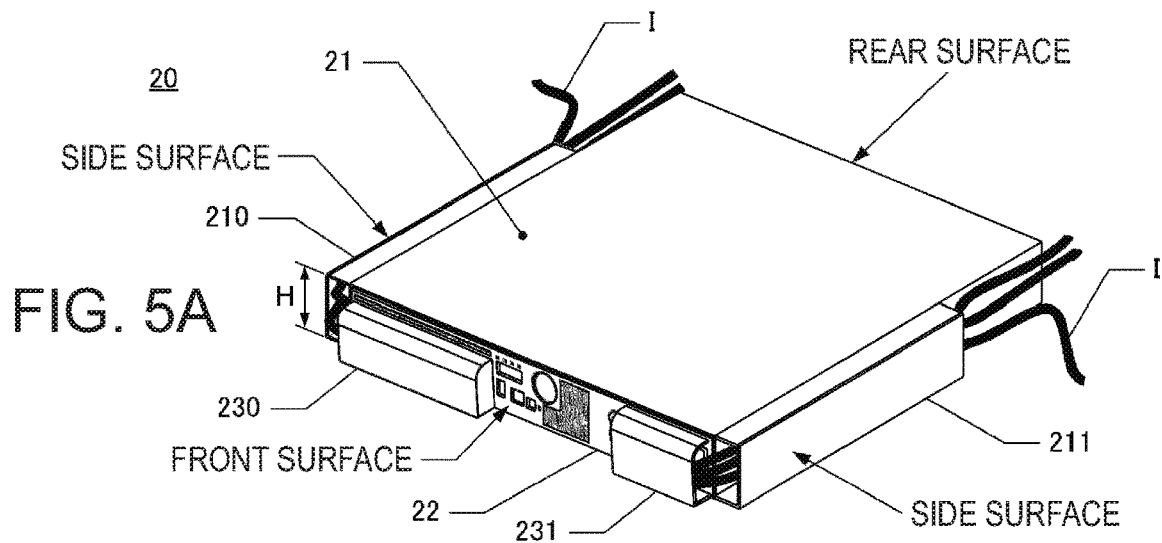
FIGS. 5A and 5B are perspective views of a robot control apparatus.
Figure 5B:
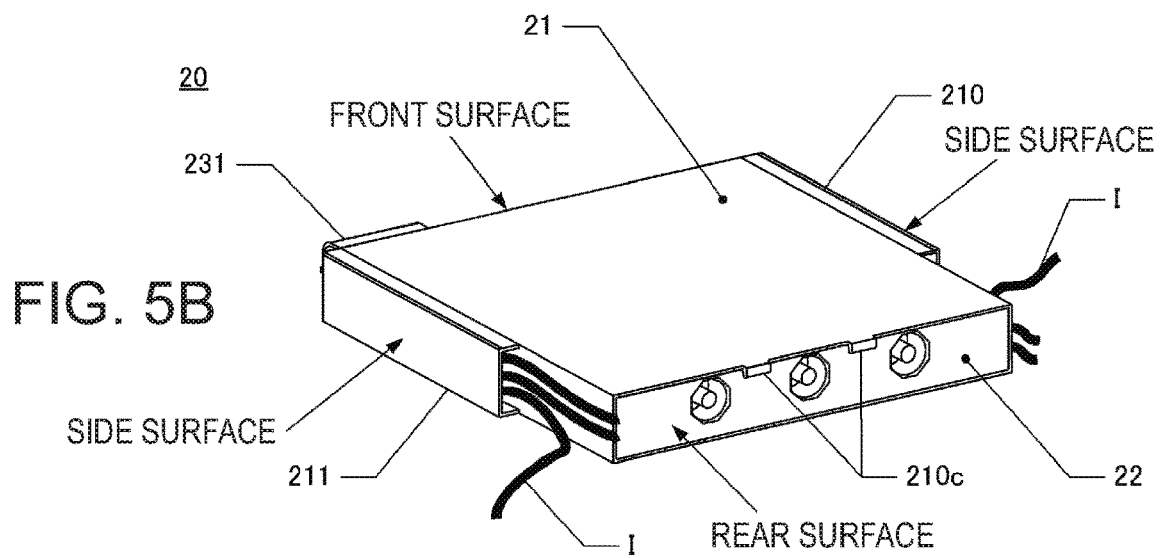

Note that, in this embodiment, the fans 221g are attached to the rear surface of the housing (see FIG. 5B). Therefore, it is possible to dispose the fans 221g in positions distant from the user who can work on the front surface side of the housing. This serves as noise measures. Further, in this embodiment, since the fans 221g are located on the rear surface of the second unit 22, it is possible to separate the second unit 22 from the first unit 21 together with the fans 221g by drawing out the second unit 22 from the first unit 21. It is possible to easily perform maintenance of the fans 221g.

As explained above, in this embodiment, a configuration is adopted in which the robot control apparatus 20 is reduced in thickness by disposing the driving board 221 and the control board 222 within the range in the height direction of the maximum height portion of the power supply board 220. As a result, the height of the housing of the robot control apparatus 20 is 70 mm. It is possible to provide the robot control apparatus 20 that can be set in a range of 2U (1.75 inches×2) of the standard of a rack mount.

(1-3) Configuration of the Cover

Figure 4A:
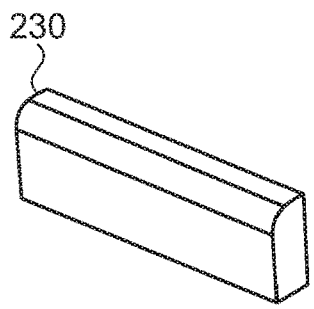
FIGS. 4A to 4F are perspective view of a cover.
Figure 4B:
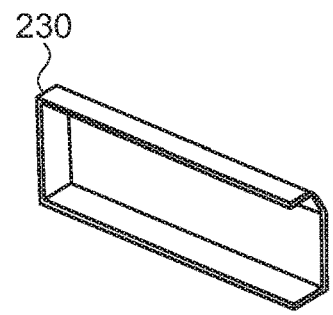
Figure 4C:
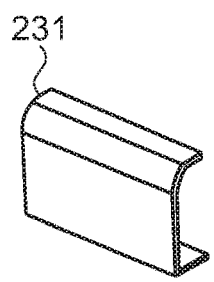
Figure 4D:
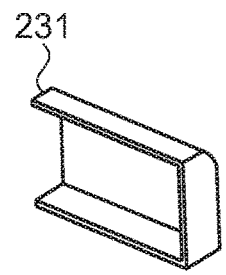
Figure 4E:
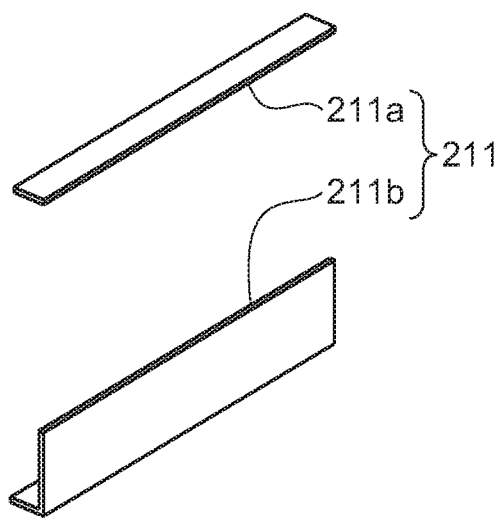
Figure 4F:
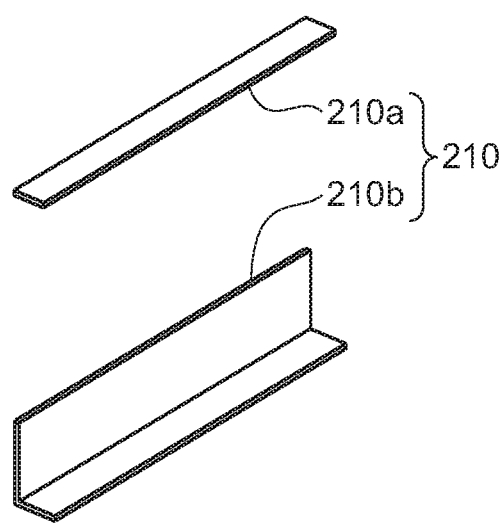

FIGS. 4A and 4B are perspective views showing the structure of the cover 230. FIGS. 4C and 4D are perspective views showing the structure of the cover 231. FIG. 4E is a perspective view showing the structure of the cover 211. FIG. 4F is a perspective view showing the structure of the cover 210. Note that FIG. 4A is a state in which the cover 230 is viewed from a direction same as the direction in FIG. 2A. FIG. 4B is a state in which the cover 230 is viewed from the rear surface side of FIG. 2A. FIG. 4C is a state in which the cover 231 is viewed from a direction same as the direction in FIG. 2A. FIG. 4D is a state in which the cover 231 is viewed from the rear side in FIG. 2A. FIGS. 4E and 4F are states in which the covers 211 and 210 are viewed from a direction same as the direction in FIG. 2A. The covers 211 and 210 are shown in a separated state.

The cover 230 is configured by a thin tabular member as shown in FIGS. 4A and 4B. The cover 230 has a schematic shape in which, among six surfaces of a rectangular parallelepiped, two surfaces (the rear surface and one side surface in the direction shown in FIG. 2A) are omitted. One ridge is formed in a round shape. As shown in FIGS. 4C and 4D, the cover 231 has structure same as the structure of the cover 230. However, the side surfaces omitted from the six surfaces of the rectangular parallelepiped are side surfaces in positions different from the positions in the cover 230.

That is, the cover 230 is attached to the cover 210 side on the front surface of the housing shown in FIG. 2A. In this state, the cover 210 side is opened. The cover 231 is attached to the cover 211 side on the front surface of the housing shown in FIG. 2A. In this state, the cover 211 side is opened. Further, the length and the height of the cover 230 and the length and the height of the cover 231 are different.

That is, in the cover 230, length in the width (width W) direction shown in FIG. 2A is larger than the length of the cover 231. Length in the height (height H) direction shown in FIG. 2A is smaller than the length of the cover 231. As a result, the cover 230 is configured such that, in a state in which the cover 230 is attached to the front surface of the second unit 22, a vent hole is exposed above the cover 230 and a part of the connectors on the front surface of the second unit 22 is exposed between the covers 230 and 231.

The cover 211 is configured by a thin tabular member as shown in FIG. 4E. The cover 211 includes a thin tubular first member 211a having a rectangular shape and a second member 211b including two rectangular surfaces orthogonal to each other. A rectangular surface of the first member 211a and smaller one of the rectangular surfaces of the second member 211b have substantially the same shapes. It is possible to attach the first member 211a to the second member 211b in a state in which both the surfaces are opposed to each other. The cover 210 has structure same as the structure shown in FIG. 4F.

Note that, in this embodiment, the covers 210 and 211 have the same length in the depth (depth D) direction in FIG. 2A. The length in the depth (depth D) direction is smaller than the length in the depth (depth D) direction of the first unit 21. Naturally, the lengths in the depth (depth D) direction of the covers 210 and 211 may be different. For example, in one of the covers 210 and 211, the length in the depth direction may coincide with the length in the depth direction of the first unit 21.

The covers 230 and 231 and the covers 210 and 211 are attached to the housing such that spaces on the inner side of the covers (between the covers and the outer surface of the housing) form passages of the external wires. Specifically, the covers 230 and 231 are attached to the front surface of the housing of the robot control apparatus 20. The covers 230 and 231 are attached such that spaces formed by the covers 230 and 231 and the front surface of the housing of the robot control apparatus 20 are opened on the side surface sides. FIGS. 5A and 5B are perspective views showing a state in which the external wires are attached to the connecting sections (the connectors, etc.) on the front surface of the robot control apparatus 20, and the covers 230 and 231 and the covers 210 and 211 are attached to the housing of the robot control apparatus 20.

In FIGS. 5A and 5B, the external wires are indicated by black solid curved lines. FIG. 5A is a diagram showing a state in which the robot control apparatus 20 is viewed from the front surface side. FIG. 5B is a diagram showing a state in which the robot control apparatus 20 is viewed from the rear surface side. In this embodiment, when the covers 230 and 231 are attached to the front surface of the housing of the robot control apparatus 20, as shown in FIGS. 5A and 5B, opening sections are formed on the side surface sides. In this embodiment, the external wires connected to the connecting sections on the front surface of the housing of the robot control apparatus 20 are drawn around to the opening sections on the side surface sides passing between the covers 230 and 231 and the front surface of the housing.

The covers 210 and 211 are attached to the side surfaces of the housing of the robot control apparatus 20. When the covers 210 and 211 are attached to the side surfaces, spaces are formed between the covers 210 and 211 and the side surfaces of the housing of the robot control apparatus 20. The front surface side and the rear surface side are opened. In this embodiment, the external wires drawn around from the opening sections formed between the covers 230 and 231 and the front surface of the housing of the robot control apparatus 20 are drawn around to the rear surface side passing between the covers 210 and 211 and the side surfaces of the housing. As explained above, in this embodiment, the external wires are drawn around to the rear surface side along the front surface and the side surfaces by the covers 230, 231, 210, and 211. Note that, on the front surface of the second unit 22, the connectors not covered by the covers 230 and 231 are also present. The external wires connected to the connectors are used, for example, when the user performs work on the front surface of the second unit 22.

In this embodiment, the covers 230 and 231 are detachably attachable. As a configuration for detachably attaching the covers 230 and 231, various configurations can be adopted. For example, it is possible to adopt a configuration in which the covers 230 and 231 are attached and detached by screws and the like. Further, in this embodiment, as shown in FIG. 2B, the connecting sections to the external wires are provided only on the front surface of the second unit (the front surface of the housing of the robot control apparatus 20). Therefore, the user is capable of easily attach and detach the external wires to and from the connecting sections present on the front surface of the second unit 22 in a state in which the robot control apparatus 20 is set in the cell 40 and the covers 230 and 231 are detached.

Further, in this embodiment, it is possible to draw out the second unit 22 from the first unit 21 and separate the second unit 22 and the first unit 21 in a state in which the robot control apparatus 20 is set in the cell 40. If the second unit 22 is drawn out from the first unit 21 in a state in which the external wires are detached from the connecting sections on the front surface of the second unit 22, it is possible to draw out the second unit 22 in a state in which the external wires are left on the first unit 21 side (between the cover 210 and the cover 211 and the side surfaces of the first unit 21). Therefore, in a state in which the external wires are detached from the connecting sections, it is possible to easily draw out the second unit 22 set in the setting section without applying a load to the external wires.

When attaching the second unit 22 to the first unit 21, the user only has to insert the second unit 22 into the first unit 21 in a state in which the first unit 21 is set in the cell 40 and thereafter attach the external wires to the connecting sections. Therefore, it is unnecessary to draw out the external wires when the user performs maintenance of the boards set on the inside of the second unit 22. After the robot control apparatus 20 is set in the cell 40, work for drawing the external wires is not performed. Therefore, in this embodiment, it is possible to fix the external wires in a predetermined state such that the length of the external wires is set to length that can be set in the cell 40. Therefore, it is easy to perform extra length management for the external wires.

Further, in the configuration explained above, the external wires pass predefined passages formed by the covers 230, 231, 210, and 211. The external wires are directed to the direction of the rear surface from the front surface of the robot control apparatus 20 along the side surfaces. Therefore, in the robot control apparatus 20, it is possible to draw around all the external wires, which are connected to the connecting sections covered by the covers 230 and 231, from the front surface to the rear surface. Since the external wires are drawn around by the covers, the length of the external wires is regulated by the covers and prevented from becoming excessively large. Therefore, it is easy to perform management of the external wires on the outside of the robot control apparatus 20.

Further, the covers 230 and 231 are detachably attachable to the front surface of the second unit 22. Therefore, it is possible to connect the external wires to the front surface of the housing in a state in which the covers 230 and 231 are detached from the housing. It is easy to perform connection work. The cover 210 can be separated into a first member 210a and a second member 210b. The cover 211 can be separated into the first member 211*a* and the second member 211*b*. Therefore, if the first members 210*a* and 211*a* are detached in a state in which the second members 210*b* and 211*b* are attached to the side surfaces of the first unit 21, it is possible to extremely easily perform work for disposing the external wires between the side surfaces of the first unit 21 and the covers 210 and 211.

Further, in this embodiment, it is possible to draw around the external wires to the rear surface side with the covers 210 and 211. Excessively wide spaces are unnecessary for the external wires on the side surfaces of the first unit 21. Therefore, in a configuration in which the length in the width direction can be regulated, for example, in the robot control apparatus 20 or the like that can be set on a rack mount, it is unnecessary to secure excessively wide spaces for the external wires on the side surface sides configuring the end faces in the width direction. Therefore, even in a configuration in which the length in the width direction can be regulated, it is unnecessary to excessively reduce the width of the robot control apparatus 20. It is possible to sufficiently increase the internal space of the robot control apparatus 20.

Further, the length in the depth direction of the covers 210 and 211 is smaller than the length in the depth direction of the first unit 21. That is, the end faces on the rear surface side in the covers 210 and 211 are located further on the front surface side than the rear surface of the housing. Therefore, like external wires I shown in FIGS. 5A and 5B, it is possible to draw around the external wires from the side surface sides to other parts rather than from the rear surface side.

(2) Other Embodiments

The embodiment explained above is an example for carrying out the invention. Besides, various embodiments can be adopted. For example, a form of the robot system 10 is not limited to the form shown in FIG. 1A and may be any other robots such as a double-arm robot, a humanoid robot, and a SCARA robot. Further, the robot control apparatus only has to be a thin robot control apparatus. A reduction in the thickness of the robot control apparatus may be achieved by a configuration in which the driving board 221 is present outside the range in the height direction of the maximum height portion of the power supply board 220. That is, a configuration may be adopted in which, in the thickness direction of the power supply board 220, the distance between a surface of the power supply board 220, on which the power supply circuit is provided, and a surface of the driving board 221, on which the driving circuit is provided, is smaller than the maximum height (R shown in FIG. 2B) of the power supply board 220.

Further, a configuration may be adopted in which a part of the components of the robot control apparatus 20 is omitted or substituted. For example, at least a part of the covers 230 and 231 is omitted and the external wires are drawn around to the rear surface along the front surface and the side surfaces of the housing mainly by the covers 210 and 211 on the side surfaces.

Figure 5C:
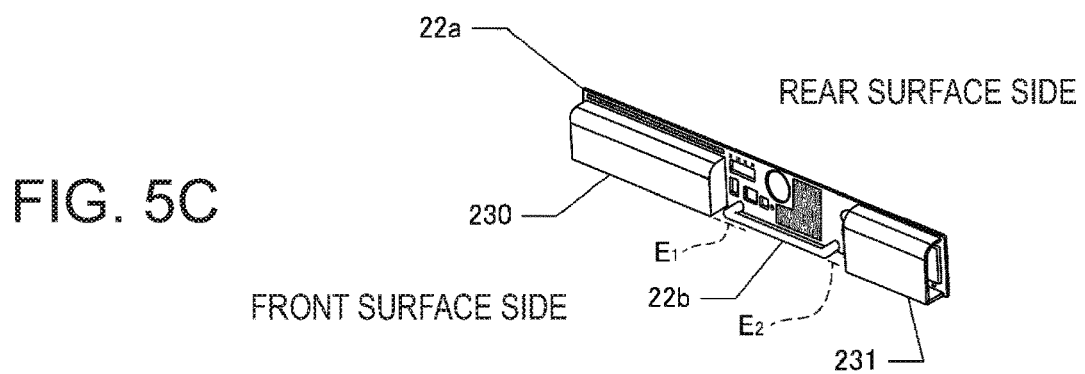
FIG. 5C is a perspective view showing a part of the second unit including a grip.

Further, other components may be added to the robot control apparatus 20. For example, a configuration may be adopted in which a grip parallel to the bottom surface is provided in the second unit. FIG. 5C is a perspective view extracting and showing a part of a second unit 22*a* including the grip. In FIG. 5C, the second unit 22*a* has a configuration substantially the same as the configuration of the second unit 22. However, the second unit 22*a* is different from the second unit 22 in that the second unit 22*a* includes a grip 22*b* on the front surface of the second unit 22*a*. The grip 22*b* is configured by a bar-like member. The grip 22*b* includes two parts extending perpendicularly to the front surface of the second unit 22*a* and one part extending in parallel to the front surface of the second unit 22*a* to connect the parts.

The directions in which the parts extend are parallel to the bottom surface of the second unit 22*a*. In this sense, the grip 22*b* is parallel to the bottom surface. In an example shown in FIG. 5C, the grip 22*b* is attached to a lower part of the front surface of the second unit 22*a*. Therefore, the grip 22*b* is attached to a position close to the bottom surface of the second unit 22*a* present on the rear side of the front surface. With the configuration explained above, the user is capable of easily drawing out the second unit 22 using the grip 22*b*. Force acting on the second unit 22*a* by the grip 22*b* easily acts as force for drawing out the bottom surface rather than bending the front surface of the second unit 22*a*. In this sense, the user can easily draw out the second unit 22*a*.

Further, in the configuration shown in FIG. 5C, an end face $E_2$ of the grip 22*b* on the front surface side of the housing is present further on the rear surface side than an end face $E_1$ of the housing on the front surface side. Therefore, in a state in which the second unit 22*a* is inserted in the first unit 21, an end face located most on the front surface side is the end face $E_1$ of the housing. The end face $E_2$ of the grip 22*b* is located further on the inner side (the rear surface side) than the end face $E_1$ of the housing. With this configuration, the grip 22*b* does not project to the front surface side. When the user performs work concerning the covers 230 and 231 and the like, the grip 22*b* does not hinder, for example, the work of the user or the like.

The power supply board only has to include the power supply circuit. The power supply circuit only has to be capable of generating electric power supplied to the other circuits (the other boards and the robot). Such a power supply circuit can be configured by, for example, a circuit that receives supply of electric power from an external power supply (e.g., a commercial power supply) supplied in a setting place of the robot control section, performs voltage conversion and frequency conversion (including conversion of a direct current/an alternating current), and generates electric power supplied to the other circuits.

The driving board only has to include the driving circuit that drives the robot with the electric power supplied from the power supply board. The driving circuit only has to be capable of driving the robot. That is, the robot is configured to realize a predetermined function when at least one or more driving sections are driven. The driving circuit is configured by a circuit that drives the driving sections. The driving sections of the robot may be configured to be driven by various mechanisms. For example, there is a configuration in which the driving sections (joints, etc.) of the robot are driven when driving sections including motors and solenoids operate.

Note that, in the circuits disposed on the inside of the robot control apparatus, in general, the capacity of the power supply circuit, which receives the supply of the electric power from the external power supply and performs power conversion and the like, is the largest. That is, in order to configure the power supply circuit, in most cases, it is necessary to mount bulk components (transformers, etc.) having height larger than the board thickness from the mounting surface of the board in the height direction. On the other hand, the driving board includes the driving circuit that uses electric power obtained after the supplied power from the external power supply is converted by the power supply board. Therefore, in general, it is possible to configure the driving circuit with a capacity smaller than the capacity of the power supply circuit.

In such a case, the relation of the maximum height of the power supply board > the maximum height of the driving board is satisfied. Therefore, by disposing the driving board within the range in the height direction of the maximum height portion of the power supply board, it is possible to reduce the height of the robot control apparatus (the restriction of the height of the robot control apparatus is substantially limited to the maximum height of the power supply board and is not affected by the other boards). Note that the driving circuit included in the driving board may include circuits that perform power conversion and frequency conversion of electric power. However, since these circuits are not circuits to which electric power is directly supplied from the external power supply, components of the driving circuit are smaller than components of the power supply circuit. Therefore, it is possible to realize a state of the maximum height of the power supply board > the maximum height of the driving board.

As a configuration for disposing the driving board within the range in the height direction of the maximum height portion of the power supply board, various configurations can be adopted. That is, the position of the upper end in the height direction of the driving board including the driving circuit only has to be lower than (or equal to) the position of the upper end in the height direction of the driving board including the power supply circuit. The position of the lower end in the height direction of the driving board including the driving circuit only has to be higher than (or equal to) the position of the lower end in the height direction of the driving board including the power supply circuit. In this range, it is possible to dispose the driving board in any position. Note that the height direction only has to be a direction perpendicular to a mounting surface of the board. When the direction is set as the height direction, it is possible to define the width direction and the depth direction in two directions perpendicular to the height direction and orthogonal to each other.

Note that, in general, the circuit occupying the largest capacity (including the highest component in the height direction) in the robot control apparatus is the power supply circuit. Therefore, by disposing the driving board within the range in the height direction of the maximum height portion of the power supply board, it is possible to easily reduce the robot control apparatus in thickness. In a situation in which a largest factor of the restriction of a reduction in thickness on the inside of the robot control apparatus is the power supply board, the reduction in thickness is realized by configuring the robot control apparatus with a housing capable of housing the maximum height portion of the power supply board.

Therefore, in the robot control apparatus reduced in thickness in this way, other components may be incorporated in the housing as long as the other components are included within the range in the height direction of the maximum height portion of the power supply board. In this case, the other components may be bulk components or may be other boards. The other boards are desirably parallel to the power supply board and the driving board (a board perpendicular to the mounting surface of the power supply board is desirably absent). However, the other boards may be directed perpendicularly to the mounting surface of the power supply board as long as the other boards are included within the range in the height direction of the maximum height portion of the power supply board.

As a configuration example in which the driving board is disposed to be included within the range in the height direction of the maximum height portion of the power supply board, a configuration may be adopted in which the driving board is disposed on the same plane as the power supply board. With the configuration, it is possible to easily dispose the driving board within the range in the height direction of the maximum height portion of the power supply board. With the configuration, compared with a configuration in which the boards are not disposed on the same plane, visibility of the boards, the circuits on the boards, the mounted components, and the like is improved. Work concerning components and the like is also facilitated. Naturally, in a configuration in which the robot control apparatus includes another board, for example, a control board including a control circuit that controls the robot, a configuration may be adopted in which the other board is disposed on the same plane as the power supply board.

In order to dispose the boards on the same plane, the boards only have to be configured such that a degree of freedom of circuit design is improved. For example, in the configuration in which the boards are not disposed on the same plane, workability is deteriorated if terminals of internal wires (wires on the inside of the robot control apparatus are referred to as internal wires and wires on the outside are referred to external wires) connected among the boards are disposed at the edges of the boards. Therefore, the positions of the terminals are easily restricted. However, if the boards are disposed on the same plane, it is possible to connect the internal wires even if the terminals are disposed at the edges of the boards. A degree of freedom of circuit design is improved. Note that the state in which the boards are disposed on the same plane only has to be realized such that reference positions of the boards (e.g., bottom surfaces of the boards or mounting surfaces of the boards) are disposed on substantially the same plane. Even if a slight error (e.g., a difference in attachment positions of approximately ±10 mm or a warp of the boards) is present, the boards are regarded as being present on the same plane.

In a configuration including the boards in the housing, electric power and signals are supplied to the boards in the housing via the various terminals and the internal wires. The electric power and the signals are sent to the outside. Therefore, connecting sections to the external wires need to be provided on the outer surface of the housing. Note that the connecting sections are desirably configured by connectors or the like and integrated in a small number of places (desirably one place (a specific surface in a housing of a polyhedron)). That is, if the connecting sections are dispersed to a large number of places, maintenance is difficult. For example, connection work of the external wires to the connecting sections is complicated. Extra length management and the like are also difficult.

Therefore, if a configuration is adopted in which a board including a largest number of interfaces to external wires among a plurality of boards is disposed closer to the front surface of a housing on the inside of the housing than a board including a smallest number of interfaces to the external wires among the plurality of boards, it is easy to integrate most of the internal wires in the housing on the front surface of the housing. Note that, when the connecting sections (the connectors, etc.) to the external wires are integrated on the front surface of the housing, the user of the robot control apparatus only has to perform connecting work of the external wires only on the front surface of the robot control apparatus. Maintenance work is extremely easy. The front surface of the housing only has to be a surface in a direction in which the user is present when viewed from the housing in a state in which the robot control apparatus is set in a setting section (a cell, etc.) and operates. In this case, the opposite side of the direction in which the user is present when viewed from the housing is the rear surface. Surfaces other than the front surface and the rear surface can change in a setting direction to the setting section of the robot control apparatus. However, when the robot control apparatus is a substantially rectangular parallelepiped and is a thin box-like housing, one of two large surfaces among surfaces between the front surface and the rear surface can be regarded as the upper surface, the other can be regarded as the bottom surface, and the remaining surfaces can be regarded as the side surfaces.

In general, a robot includes multiple joints and includes a plurality of individual driving sections (motors, solenoids, etc.) for individually driving the joints. Since the driving board includes the driving circuit for driving the robot, the driving board often includes individual circuits (e.g., power converting sections) for driving the plurality of driving sections. Therefore, a plurality of heat generating bodies (circuits) are often present in the driving circuit included in the driving board. Therefore, in a configuration including fans disposed in positions closer to the driving board than the power supply board, it is possible to efficiently cool the driving circuit of the driving board. Naturally, when boards other than the power supply board and the driving board are present in the housing, it is desirable to dispose the driving board in a position closest to the fans.

In a configuration in which the fans are located on a surface different from the front surface of the housing, the surface different from the front surface may be any one of the side surface, the rear surface, the upper surface, and the bottom surface. However, the fans are desirably provided on the rear surface distant from the user because a noise reducing effect is higher.

A configuration in which the height of the robot control apparatus is 30 mm or more and 89 mm or less can be easily realized by disposing the driving board within the range in the height direction of the maximum height portion of the power supply board. Various values can be adopted as the range of the height. If the height is set to 1.75 inches (approximately 44.45 mm) or less, it is possible to provide the robot control apparatus that can be set in a range of 1U.

In a configuration in which at least a part of the external wires connected to the robot control apparatus is drawn around along the front surface and the side surfaces by covers, it is possible to draw around all the external wires, which are connected to the connecting sections covered by the covers, from the front surface to the rear surface. Since the external wires are drawn around by the covers, the length of the external wires is regulated by the covers and is prevented from becoming excessively large. Therefore, it is easy to manage the external wires on the outside of the robot control apparatus.

The covers only have to be members that form passages of the external wires in a state in which the covers are attached to the housing. The covers only have to be configured such that a direction in which the external wires are drawn around can be specified when the passage are formed. For example, if covers including surfaces opposed to the surfaces (the front surface and the side surfaces) of the housing are configured, it is possible to configure the covers that form passages of the external wires between the opposed surfaces and the surfaces of the housing. The covers only have to form the passages of the external wires and the shape of the covers is not limited. The shape may be determined according to the number of external wires included in the robot control apparatus. Further, the covers may be attached to the second unit or may be attached to the first unit.

In a configuration in which the connecting sections to the external wires are provided only on the front surface of the housing on the outer surface of the housing, it is unnecessary to connect the external wires to the connecting sections in advance before setting the robot control section in the setting section. Even if the length and a route of the external wires in the setting section are fixed to predetermined states, it is possible to connect the external wires to the robot control apparatus. Therefore, it is easy to manage the external wires. If the external wires are detached from the connecting sections, it is possible to easily detach the robot control apparatus set in the setting section without applying a load to the external wires.

In a configuration in which at least a part of a cover is detachable, a detachable part in the cover only has to have a shape and a size for facilitating connection work of the external wires. The entire cover may be detachable. In a configuration in which a plurality of covers are attached to the housing, a part of the covers may be detachable.

In a configuration in which the length in the width direction can be regulated, for example, a configuration in which, in a robot control apparatus or the like that can be set on a rack mount, external wires are drawn around to the rear surface side of a housing along the side surfaces of the housing, it is unnecessary to secure excessively wide spaces for the external wires on the side surface sides configuring the end faces in the width direction. It is possible to secure a wide space as a space usable by the robot control apparatus.

In a configuration in which the second unit is separable from the first unit by being drawn out from the first unit, since the second unit can be separated from the first unit, wide spaces are unnecessary on the left and the right of the robot control section in order to perform maintenance of the second unit. Therefore, it is possible to provide the robot control section capable of easily performing maintenance.

The housing only has to include the first unit and the second unit. The housing including the first unit and the second unit configures the outer surface of the robot control apparatus to form a housing. Note that, when the robot control section is set in the setting section, a part of the housing, for example, the first unit is desirably fixed to the setting section.

The robot control section includes a circuit for controlling the robot. The robot control section can be configured by one or more boards including circuits. Naturally, the robot control section may be configured by circuits other than the circuits on the boards, components, and the like. The circuits may be configured by circuits having various functions. Examples of the circuits include a circuit that receives the supply of electric power from the external power supply and performs voltage conversion and frequency conversion, a circuit for driving the driving sections (motors, actuators, and the like) of the robot, and a circuit for controlling the operation of movable sections of the robot.

The second unit only has to be separable from the first unit by being drawn out from the first unit. Therefore, it is possible to move the second unit in at least one direction with respect to the first unit. The second unit only has to be configured to be separable from the first unit by being moved to a state in which the second unit and the first unit are not in contact.

As a configuration for drawing out the second unit from the first unit, various configurations can be adopted. The second unit only has to be able to be relatively moved at least in one direction with respect to the first unit. For example, a configuration can be adopted in which a contact part of the first unit and the second unit is formed in a shape for moving the second unit in one direction. The contact part may be a rail or the like for regulating a moving direction of the second unit. The shape itself of the contact part may be a shape for regulating the moving direction of the second unit. Examples of the latter include a configuration in which a recessed section, in which the second unit can be fit, is formed in the first unit and a configuration in which the first unit has a shape into which the second unit can be inserted.

As a configuration of the regulating section, various configurations can be adopted. The regulating section can be configured by a stopper or the like that comes into contact with a predetermined part such as the end face of the second unit to thereby regulate the movement of the second unit. Naturally, the second unit may be fixable to the first unit in a state in which the movement of the second unit is regulated.

The housing may have any shape. However, the housing may include a rectangular parallelepiped portion, the first unit may configure the upper surface, the bottom surface, and the side surfaces of the rectangular parallelepiped portion of the housing, and the second unit may configure the front surface, the rear surface, and the bottom surface of the rectangular parallelepiped portion of the second unit. That is, when the first unit configures the upper surface, the bottom surface, and the side surfaces in the rectangular parallelepiped and the second unit configures the front surface, the rear surface, and the bottom surface in the rectangular parallelepiped, if the second unit is configured to be movable back and forth (in a direction perpendicular to the front surface and the rear surface) while disposing the bottom surface of the second unit on the bottom surface of the first unit, it is possible to configure the second unit that can be drawn out from the first unit in the rectangular parallelepiped housing. In this case, the second unit only has to have a size that can be inserted into the inner sides of the surfaces of the first unit.

Note that the first unit may include two side surfaces or may include one surface. That is, if the first unit includes the two side surfaces, the first unit is configured by a cylindrical body including a rectangular opening sections. If the first unit includes the one side surface, the first unit is configured by a structure including three surfaces except one surface of the cylindrical body including the rectangular opening sections.

In a configuration in which the fans are located on a surface different from the front surface of the housing, the surface different from the front surface may be any one of the side surface, the rear surface, the upper surface, and the bottom surface. However, the fans are desirably provided on the rear surface, which is the surface most distant from the user, because a noise reducing effect is higher. Further, in a configuration in which the fans are located on the rear surface, it is possible to separate the second unit from the first unit together with the fans by drawing out the second unit from the first unit. It is possible to easily perform maintenance of the fans.

In a configuration in which the connecting sections to the external wires are provided only on the front surface of the housing, the external wires only have to be attached to and detached from the connecting sections after the second unit is inserted into the first unit set in the setting section. Therefore, it is unnecessary to connect the external wires to the connecting sections in a state in which the second unit and the first unit are separated. Even if the length and a route of the external wires in the setting section are fixed to predetermined states, it is possible to connect the external wires to the connecting sections. Therefore, it is easy to manage the external wires. If the external wires are detached from the connecting sections, it is possible to easily draw out the second unit set in the setting section without applying a load to the external wires.

The entire disclosure of Japanese Patent Application No.: 2015-161677, filed Aug. 19, 2015, 2015-161678, filed Aug. 19 and 2015-161679, filed Aug. 19, 2015 are expressly incorporated by reference herein.

What is claimed is:

1. A robot control apparatus comprising:
a case that houses components of the robot control apparatus, the case having a bottom plate;
a power supply board including a power supply component that is configured to supply electric power, the power supply board being disposed on the bottom plate of the case, a top surface of the power supply component extending along a first plane parallel to the bottom plate of the case, a height between the top surface of the power supply component and a bottom surface of the power supply board being a first value;
a driving board including a driving component that is configured to drive a robot with the electric power supplied from the power supply component, the driving board being disposed on the bottom plate of the case, a top surface of the driving component extending along a second plane parallel to the bottom plate of the case: and
a control board including a control component that is configured to control the robot, the control board being disposed on the bottom plate of the case, wherein
a distance between the first and second planes is smaller than the first value, and
the power supply board, the driving board, and the control board are respectively disposed on parallel planes.

2. The robot control apparatus according to claim 1, wherein a height between the top surface of the driving component and a bottom surface of the driving board is a second value, and
the first value is larger than the second value.

3. The robot control apparatus according to claim 1, wherein the case houses a plurality of boards including the power supply board the driving board, and the control board, and the case is boxed-shaped so as to have front and rear surfaces connected to the bottom plate- of the case,
a board including a largest number of interfaces to external wires among the plurality of boards is disposed closer to the front surface of the case than a board including a smallest number of interfaces to the external wires among the plurality of boards.

4. The robot control apparatus according to claim 1, further comprising:
a fan disposed in the case, and the fan is located closer to the driving board than the power supply board.

5. The robot control apparatus according to claim 1, further comprising:
a fan that is disposed in the case,
wherein the fan is located on a surface different from a front surface of the case.

6. The robot control apparatus according to claim 1, wherein a height of the robot control apparatus is 30 mm or more and 89 mm or less.

7. A robot comprising:
   a plurality of driving members; and
   the robot control apparatus according to claim 1,
   wherein the plurality of driving members are driven by the driving component of the driving board.

\* \* \* \* \*